United States Patent
Lukofsky et al.

(10) Patent No.: US 10,283,883 B2
(45) Date of Patent: May 7, 2019

(54) SPACE-SAVING MICRO-COAX CABLE HARNESS

(71) Applicant: Microsoft Technology Licensing, LLC, Redmond, WA (US)

(72) Inventors: David Lukofsky, San Francisco, CA (US); Hanfeng Wang, San Jose, CA (US); Joseph Christopher Bolling, San Francisco, CA (US); Patrick Timothy Codd, Belmont, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 11 days.

(21) Appl. No.: 15/417,772

(22) Filed: Jan. 27, 2017

(65) Prior Publication Data
US 2018/0219310 A1    Aug. 2, 2018

(51) Int. Cl.
H01R 12/59    (2011.01)
H01R 12/52    (2011.01)
(Continued)

(52) U.S. Cl.
CPC ......... *H01R 12/52* (2013.01); *H01B 11/1808* (2013.01); *H01R 12/598* (2013.01);
(Continued)

(58) Field of Classification Search
CPC ...... H01R 12/596; H01R 12/77; H01R 12/79; H01R 12/775; B60R 16/0207; H01B 7/0045; H05K 2201/10272
(Continued)

(56) References Cited

U.S. PATENT DOCUMENTS

| 5,281,762 A | * | 1/1994 | Long | ................... | H01R 9/0515 |
| | | | | | 174/117 F |
| 7,906,730 B2 | | 3/2011 | Atkinson et al. | | |

(Continued)

FOREIGN PATENT DOCUMENTS

| JP | 2007280772 A | 10/2007 |
| JP | 2009170142 A | 7/2009 |

(Continued)

OTHER PUBLICATIONS

"0.5 mm pitch, Next Generation High Speed Board-to-Wire Connectors", Published on: Jun. 16, 2014 Available at: https://www.hirose.co.jp/cataloge_hp/ed_FX16_20140616.pdf (24 pages total).

(Continued)

*Primary Examiner* — Abdullah A Riyami
*Assistant Examiner* — Justin M Kratt
(74) *Attorney, Agent, or Firm* — Mark K. Young; Mayer & Williams PC

(57) ABSTRACT

In an electronic device having a compact form factor, a space-saving harness using bundled or ribbonized strands of micro-coaxial (micro-coax) cable may be utilized to provide signal and/or power interconnects between EMI-generating peripheral components and other components in the device such as those populated on circuit boards. Discrete wires are included in the harness to provide shielding to adjacent micro-coax conductors which may carry high speed signals such as MIPI (Mobile Industry Processor Interface) differential signal pairs and provide power and ground return paths. The discrete wires are subjected to fabrication processes during assembly of the micro-coax harness so that their outer diameters substantially match that of components in the micro-coax cable to thereby facilitate connectorization or termination to the circuit boards and/or other components in the device. The matching outer diameters can also provide (Continued)

a consistent pitch that may facilitate space-saving geometries for the harness, connector, and/or terminations.

17 Claims, 11 Drawing Sheets

(51) Int. Cl.

| | | |
|---|---|---|
| H01R 13/02 | (2006.01) | |
| H01B 11/18 | (2006.01) | |
| H05K 1/11 | (2006.01) | |
| H05K 1/14 | (2006.01) | |
| H01R 24/50 | (2011.01) | |
| H01R 103/00 | (2006.01) | |
| H01R 12/79 | (2011.01) | |
| H01R 12/77 | (2011.01) | |
| B60R 16/02 | (2006.01) | |
| H01B 7/00 | (2006.01) | |
| H01B 11/20 | (2006.01) | |
| H01R 9/05 | (2006.01) | |
| H01R 12/53 | (2011.01) | |
| H01R 13/6471 | (2011.01) | |

(52) U.S. Cl.
CPC ........... *H01R 13/025* (2013.01); *H01R 24/50* (2013.01); *H05K 1/111* (2013.01); *H05K 1/145* (2013.01); *B60R 16/0207* (2013.01); *H01B 7/0045* (2013.01); *H01B 11/203* (2013.01); *H01R 9/0515* (2013.01); *H01R 12/53* (2013.01); *H01R 12/596* (2013.01); *H01R 12/77* (2013.01); *H01R 12/775* (2013.01); *H01R 12/79* (2013.01); *H01R 13/6471* (2013.01); *H01R 2103/00* (2013.01); *H05K 2201/10272* (2013.01)

(58) Field of Classification Search
USPC ..... 439/98, 329, 497; 174/72 A, 72 B, 71 R, 174/72 C, 72 TR, 74 R, 75 C, 78, 79, 174/84 R, 88 R, 88 C
See application file for complete search history.

(56) References Cited

U.S. PATENT DOCUMENTS

| | | | | |
|---|---|---|---|---|
| 7,973,239 B2 * | 7/2011 | Koyama | ............. | H01R 9/0506 174/74 R |
| 8,011,950 B2 * | 9/2011 | McGrath | ............. | H01R 12/594 439/497 |
| 8,292,655 B1 * | 10/2012 | Ling | ............. | H01R 9/038 439/497 |
| 9,548,549 B1 | 1/2017 | Masuyama et al. | | |
| 2005/0079771 A1 | 4/2005 | DeLessert et al. | | |
| 2008/0036864 A1 * | 2/2008 | McCubbrey | ............. | H04N 7/18 348/159 |
| 2008/0064254 A1 * | 3/2008 | Kuo | ............. | H05K 3/3405 439/493 |
| 2010/0065327 A1 | 3/2010 | Lin et al. | | |
| 2011/0244723 A1 | 10/2011 | Kojima | | |
| 2012/0327546 A1 | 12/2012 | Ichimura et al. | | |
| 2013/0016022 A1 | 1/2013 | Heiks et al. | | |
| 2014/0014410 A1 | 1/2014 | Tanaka | | |
| 2014/0199885 A1 | 7/2014 | Vinther et al. | | |
| 2015/0111402 A1 * | 4/2015 | Hackman | ............. | H01R 13/648 439/98 |
| 2015/0364846 A1 | 12/2015 | Chen et al. | | |

FOREIGN PATENT DOCUMENTS

| | | | |
|---|---|---|---|
| JP | 2012049035 A | * | 3/2012 |
| JP | 2012049035 A | | 3/2012 |

OTHER PUBLICATIONS

"HRS product presentation", Retrieved on: May 16, 2016 Available at: http://hrs.hiroseusa.com/WebEx_presentations/webex_WTB.pdf (24 pages total).

"Laser Wire and Cable Marking, Stripping, and Cutting", Retrieved on: May 16, 2016 Available at: http://www.cmslaser.com/industrial-applications-for-lasers/wire-and-cable (5 pages total).

"Selection guideline of SEI's Internal wiring materials for high speed transmission", Published on: Dec. 2009 Available at: Selection guideline of SEI's Internal wiring materials for high speed transmission (11 pages total).

"Micro Coax Cable Assembly w/ ERNI MicroSpeed® Connectors", Retrieved on: May 16, 2016 Available at: http://meritec.com/wp-content/uploads/2014/03/Micro-Coax-Cable-Assembly-ERNI-Datasheet.pdf (2 pages total).

"International Search Report and Written Opinion Issued in PCT Application No. PCT/US2018/014304", dated May 23, 2018,13 Pages.

* cited by examiner

SPACE-SAVING MICRO-COAX CABLE HARNESS

BACKGROUND

Electro-magnetic interference (EMI) is typically emitted within the radio frequency (RF) spectrum during the operation of electronic devices.

SUMMARY

In an electronic device having a compact form factor, such as a head mounted display (HMD) device, a space-saving harness using bundled or ribbonized strands of micro-coaxial (micro-coax) cable may be utilized to provide signal and/or power interconnects between EMI-generating peripheral components and other components in the device such as those populated on circuit boards. Discrete wires are included in the harness to provide shielding to adjacent micro-coax conductors which may carry high speed signals such as MIPI (Mobile Industry Processor Interface) differential signal pairs and provide power and ground return paths. The discrete wires are subjected to fabrication processes during assembly of the micro-coax harness so that their outer diameters substantially match that of components in the micro-coax cable to thereby facilitate connectorization or termination to the circuit boards and/or other components in the device. The matching outer diameters can also provide a consistent pitch (i.e., spacing between adjacent micro-coax cables and discrete wires) that may facilitate space-saving geometries for the harness, connector, and/or terminations.

In a first illustrative space-saving micro-coax harness embodiment, the ends of the discrete wires are shaped using laser etching or other suitable process to have substantially the same outer diameter as the inner cores of the micro-coax cable strands. The ends of the discrete wires can be terminated on ground pads on the respective circuit boards to thereby create low-impedance paths to ground. Conducting ground bars that are configured for conductive engagement with exposed conductors of the discrete wires and conductive engagement with shields of the micro-coax cable strands are utilized on either end of the harness to provide additional low-impedance ground paths.

In a second illustrative space-saving micro-coax harness embodiment, the discrete wires are cut to length using a laser etching or other suitable process and the outer diameters of the wire ends are matched to that of the shield in the micro-coax cable strands. Ground bars providing conductive engagement with exposed conductors of the discrete wires and shields of the micro-coax cable are utilized at either end of the micro-coax cable harness. Conducting fingers laterally extend from the ground bars and are terminated on ground pads on the respective circuit boards to provide multiple low-impedance ground paths.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

DESCRIPTION OF THE DRAWINGS

Like reference numerals indicate like elements in the drawings. Elements are not drawn to scale unless otherwise indicated.

DETAILED DESCRIPTION

Figure 1:
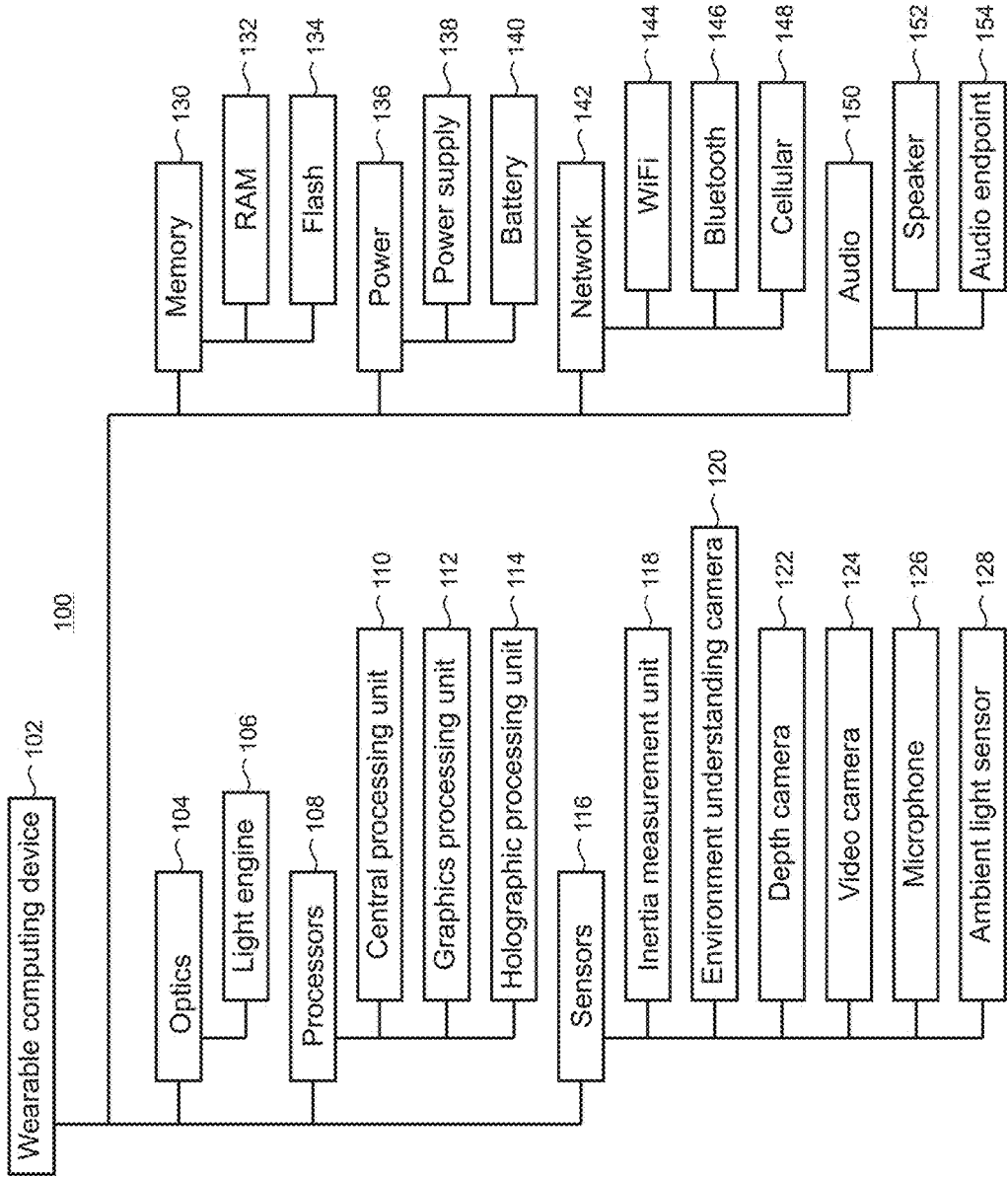
FIG. 1 is a block diagram of an illustrative arrangement of electronic components that may be included in a compact form factor electronic device and which may be sources of electro-magnetic interference (EMI) energy during device operation.

FIG. 1 is a high-level functional block diagram of an illustrative arrangement of electronic components 100 that may be included in a compact form factor electronic device such as a wearable computing device 102 (illustrative examples of which are described below). The components shown are illustrative and not every component may be utilized in a given device implementation. In addition, single or multiple instances of a component may be used in some implementations. For example, a device may have multiple processors and sensors. The components 100 and associated circuits and interconnects in the device 102 may be sources of electro-magnetic interference (EMI) energy when the device 102 operates. EMI emission typically needs to be managed in electronic devices and can fall under various regulatory schemes and standards such as Title 47, Part 15, Subpart B of the rules and regulations of the Federal Communications Commission (FCC) in the United States.

Since compact form factor electronic devices have inherent limitations on space, the electronic components 100 typically need to be packaged in the device 102 in a way that meets the design goals covering a variety of characteristics, features, and user experiences supported by the device. So, for example, optimization of ergonomic and usage factors may result in sub-optimal EMI emission characteristics.

Device designers typically engage in some balancing of factors, characteristics, and performance in order to meet their goals. The present space saving micro-coax cable harness may enhance flexibility and provide additional design freedom while still effectively dealing with EMI emission management.

As shown in FIG. 1, the components include: optics 104 such as light engine 106; processors 108 such as a central processing unit 110, graphics processing unit 112, and holographic processing unit 114; sensors 116 such as inertia measurement unit 118, environment understanding camera 120, depth camera 122, video camera 124, microphone 126, and ambient light sensor 128; memory 130 such as RAM 132 and flash 134; power 136 such as power supply 138 and battery 140; network 142 such as Wi-Fi network interface 144, Bluetooth network interface 146, and cellular network interface 148; and audio 150 such as speaker 152 and support for an audio endpoint 154, including headsets, earphones, and the like.

Figure 2:
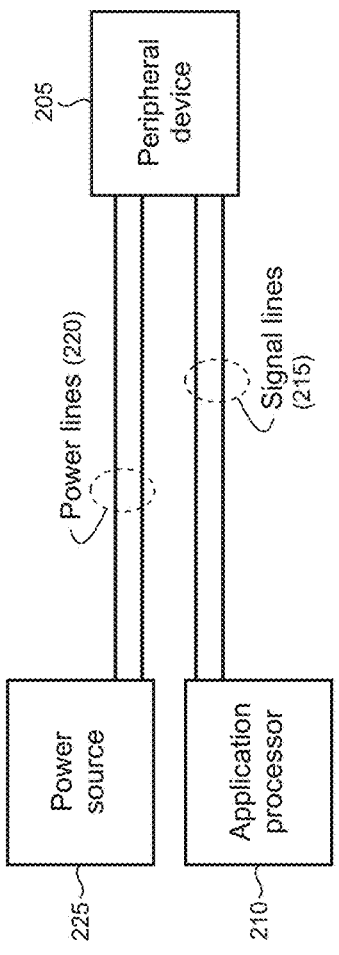
FIG. 2 is a block diagram of an illustrative arrangement of electronic elements including a peripheral device operatively coupled to an application processor and power source over respective signal and power lines.

FIG. 2 is a block diagram of an illustrative arrangement 200 of electronic elements in which a peripheral device 205, such as a sensor or other component, is operatively coupled to an application processor 210 over signal lines 215. The signal lines 215 may be implemented using micro-coax cable, as shown below in FIG. 4 and described in the accompanying text. The interfaces between elements may be proprietary in some implementations, or be described by specifications such as those published by the MIPI (Mobile Industry Processor Interface) Alliance, for example. The signal lines 215 comprise conductors that are configured in pairs to support differential signaling in which the peripheral device 205 transmits signals as a differential pair that are driven 180 degrees out of phase. A receiver in the application processor 210 recovers a signal as the voltage difference on the two signal lines. Although requiring two signal lines rather than one, differential signals are more immune to noise than single-ended signals using a single conductor and ground because external noise affects both conductors equally.

In this example, a single pair of conductors are used to implement signal lines for a differential data signal as an output from the peripheral device 205. However, other numbers and arrangements of conductors may be utilized in other implementations, including both inputs and outputs to or from the peripheral device 205 and application processor 210, and the present space-saving micro-coax cable harness is not limited to any particular number of conductor pairs. A pair of power lines 220 provides power and return path to the peripheral device 205 from a power source 225. In some implementations, the ground shield in a micro-coax cable is not utilized to carry return current.

Figure 3:
FIG. 3 is a block diagram of an illustrative implementation for an arrangement of electronic elements including an image sensor that is operatively coupled to a main printed circuit board through a cable harness.

FIG. 3 is a block diagram an illustrative implementation for an arrangement 300 of electronic elements in which a peripheral device is embodied as an image sensor 305 that is operatively coupled to a main circuit board 325 by a cable harness 315 and respective connectors 318 and 320. The connectors 318 and 320 may be optionally utilized in some implementations, in which case one or more strands of micro-coax cable may be directly coupled to the respective circuit boards using one or more of solder, conductive adhesive, metallic plating, friction fit, fastener, latch, or any suitable method.

The image sensor may be mounted on a peripheral device circuit board 310 which may be implemented as a printed circuit board or flexible circuit board. The peripheral device circuit board 310 is optionally utilized as the image sensor can be operatively coupled to the micro-coax harness directly in some implementations. The image sensor may be embodied as a CMOS (Complementary Metal Oxide Silicon) or CCD (charge-coupled device) camera. The main circuit board 325 supports various components including a processor 330 that interacts with the image sensor and a power bus 335 that supplies power to the peripheral device circuit board and/or image sensor. The main circuit board is a rigid printed circuit board in this illustrative example, but may also comprise a flexible printed circuit in some implementations.

The cable harness 315 implements the differential signal lines that support communication between the image sensor 305 and the application processor on the main circuit board 325 using multiple strands of micro-coax cable. The support for high-speed differential signaling in the device is one exemplary source of EMI energy. The micro-coax harness can also provide power and/or return paths as illustratively shown in the illustrative embodiments in FIGS. 8 and 9 and described in the accompanying text. The cable strands can be configured in a flexible bundle or ribbon to enable the harness to assume two- or three-dimensional configurations to support device packaging geometries that might not be possible with other types of conductor arrangements. In some cases, the strands may be partially or fully encased in a substrate such as flexible polymer, matrix, semi-rigid material, or fully rigid material.

Ribbonized micro-coax harnesses are typically configured with cable strands of a fixed pitch (i.e., distance between adjacent strands). The micro-coax harness may be utilized, for example, as a component of an electronic device such as a head mounted display (HMD) device and other portable electronic devices as respectively shown in FIGS. 11-13 and described in the accompanying text below.

Figure 4:
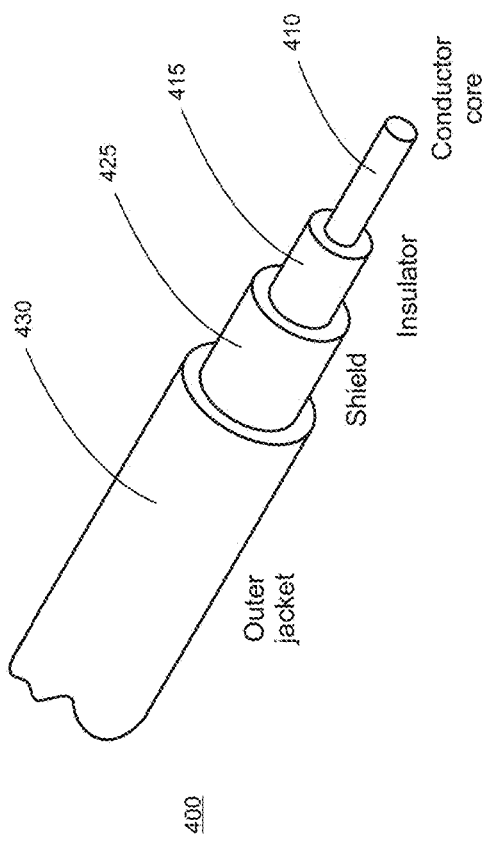
FIG. 4 shows a cutaway, cross-sectional view of a portion of a micro-coax cable.

As shown in FIG. 4, a micro-coax cable 400 typically comprises a conducting inner core 410 surrounded by a dielectric insulator 415 which, in turn, is covered by a shield 425 (e.g., a braided conductive material) and a polymer outer jacket 430. The micro-coax industry has not defined what conductor size constitutes a micro-coax, as opposed to regular coaxial cable, but generally conductor diameters of 30 AWG (American Wire Gauge) and smaller may be considered micro-coax.

Mechanical stripping is not utilized in the assembly of micro-coax harnesses in typical implementations due to their small size. Instead, single micro-coax cable strands or ribbonized micro-coax cables can be subjected to a laser stripping process. Different types of lasers can be used during the process depending on the type of material being processed. For example, a carbon dioxide laser provides light in the far-infrared portion of the spectrum which is strongly absorbed by polymers but harmlessly reflected from metallic conductors and shields. A fiber laser produces near-infrared light that is strongly absorbed by metallic shields but weakly interacts with polymer insulation and dielectrics.

The laser stripping process involves a sequence of steps including cutting the outer jacket 430, using a carbon dioxide laser or other suitable laser, and pulling it back to reveal the shield 425. A fiber laser or other suitable laser can cut the shield 425 which is pulled back along with the jacket slug (i.e., the material that is eventually discarded from the cable as the harness is assembled). The dielectric insulator 415 is cut by the carbon dioxide laser and the slug (including the outer jacket, shield, and the insulator) is pulled back to reveal the conductor core 410. The slugs can be held together during the laser stripping process to help maintain pitch of the cables for connectorization.

Figure 5:
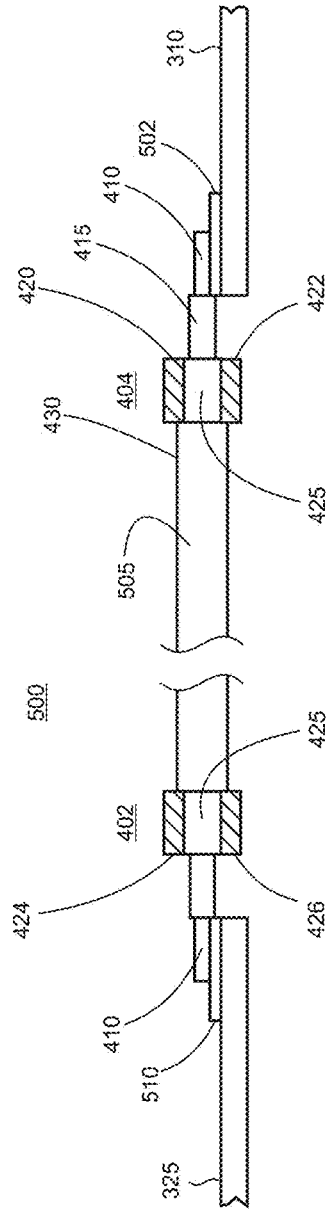
FIG. 5 shows a side view of an illustrative micro-coax cable harness that is operatively coupled between respective circuit boards.

FIG. 5 shows a side view of an illustrative micro-coax cable harness 500 that is operatively coupled between respective circuit boards 310 and 325. As used herein, the term "harness" means an arrangement of multiple strands of coaxial and/or micro-coax cables which may further include discrete wires, as shown in the illustrative embodiments in FIGS. 8 and 9 and described in the accompanying text. The harness can take ribbonized, non-ribbonized, or bundled configurations, or use combinations of such configurations. The harness 500 can further include connectors which may be configured with ground bars (and ground bar fingers in some embodiments, as described below).

As shown, a core 410 of a representative strand of micro-coax cable 505 in the harness 500 is electrically coupled to a conductive pad 502 (e.g., a copper pad) that is exposed on the peripheral device circuit board 310. The core 410 on the other end of the cable strands is electrically coupled to a signal pad 510 on the main circuit board 325. The electrical coupling may be effectuated solder, conductive adhesive, metallic plating, friction fit, fastener, latch, or any suitable method.

Ground bars 402 and 404, comprising upper and lower conducting portions, respectively indicated by reference numerals 420, 422, 424, and 426 are utilized on each end of the micro-coax cable harness and are configured to be electrically coupled to the exposed shield 425 on each end. Each set of ground bars 402 and 404 may be incorporated into respective connectors such as connectors 318 and 320 (FIG. 3), or may be implemented as standalone components in some cases (connectors are not shown in FIG. 5 for sake of clarity in exposition). In alternative implementations, one or more of the ground bars 402 and 404 may be configured with only an upper bar, or a lower bar, but not both, and other suitable ground bar arrangements may also be used to meet the needs of a particular implementation.

Figure 6:
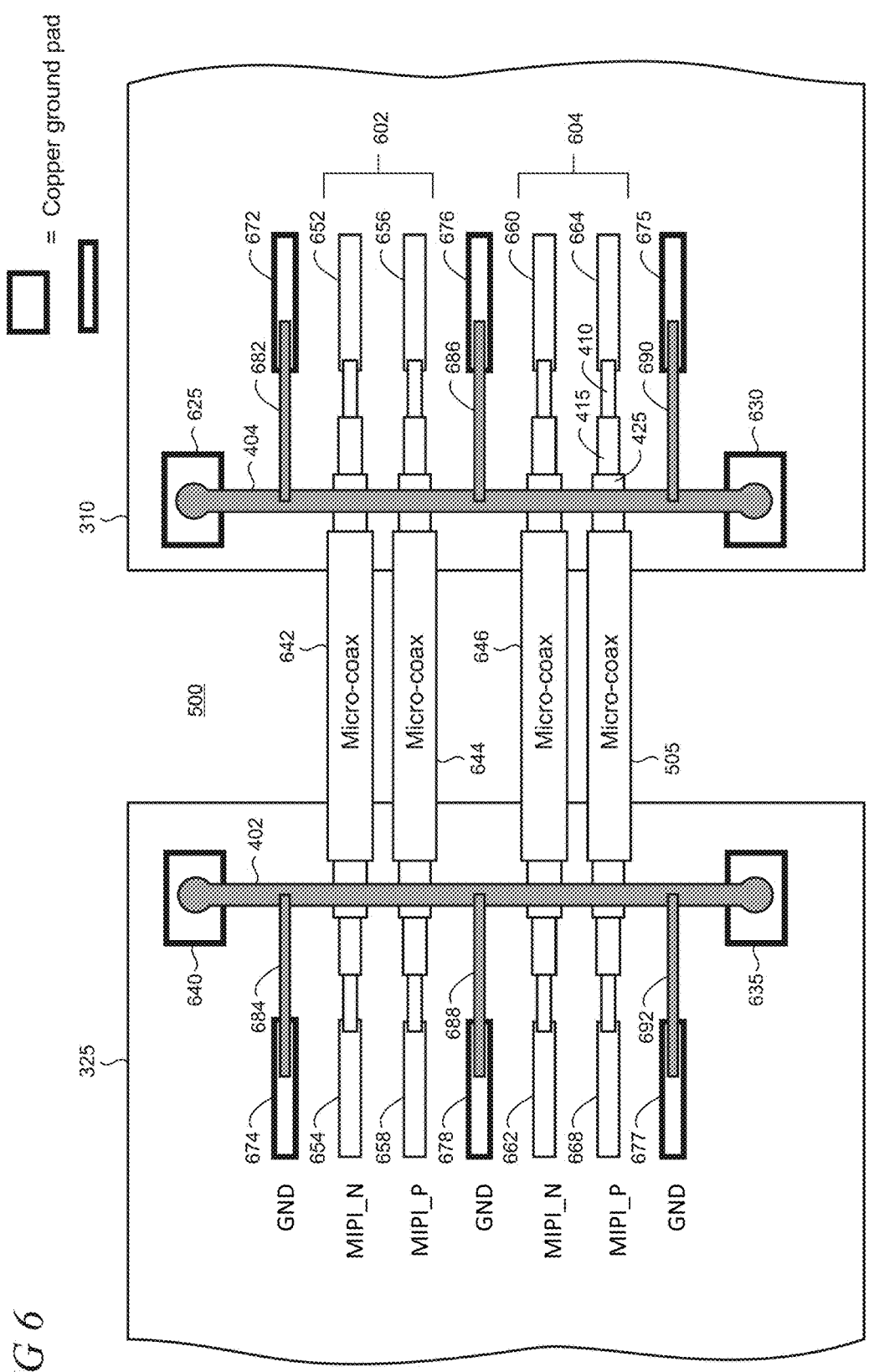
FIG. 6 shows a top view of an illustrative micro-coax cable harness and ground bars.

The upper and lower ground bars on each end of the harness 500 are electrically coupled to ground pads on the circuit boards to thereby create a ground path for the shield 425. Illustrative ground pads 625, 630, 635, and 640 on the circuit boards 310 and 325 are shown in FIG. 6 in a top view of the micro-coax harness 500. As shown, the top ground bar extends across the harness 500 which includes four strands of micro-coax cable, as indicated by reference numerals 642, 644, 646, and 505. The top and bottom ground bars are electrically coupled to the exposed shields on each of the micro-coax cable strands and the ends of the ground bars are electrically coupled to the respective grounds pads 625, 630, 635, and 640 to create a ground path between the shields of the micro-coax cable strands in the harness 500 and ground. The electrical coupling may be effectuated using solder, conductive adhesive, metallic plating, friction fit, fastener, latch, or any suitable method.

In this example, the four strands of micro-coax are configured to support two lanes of differential pairs (as indicated by reference numerals 602 and 604), each comprising MIPI P (true) and N (inverted) signals. Corresponding MIPI signal pads 652, 654, 656, 658, 660, 662, 664, and 668 on the respective circuit boards 310 and 325 are located on either side of the two MIPI conductor pairs, as shown. Operation of high-speed differential signaling on the MIPI conductor pairs can generate noise which typically can be managed by provisioning additional ground pads 672, 674, 676, 678, 675, and 677 between adjacent MIPI lanes.

Ground paths between the ground bars and the additional ground pads are implemented using extending conducting fingers 682, 684, 686, 688, 690, and 692, as shown. The fingers extend laterally to the long axis of the ground bars and are substantially parallel to the direction of the conductors. The conducting fingers may be terminated on the respective ground pads 672, 674, 676, 678, 675, and 677 using solder, conductive adhesive, metallic plating, friction fit, fastener, latch, connector, or any suitable method.

Figure 7:
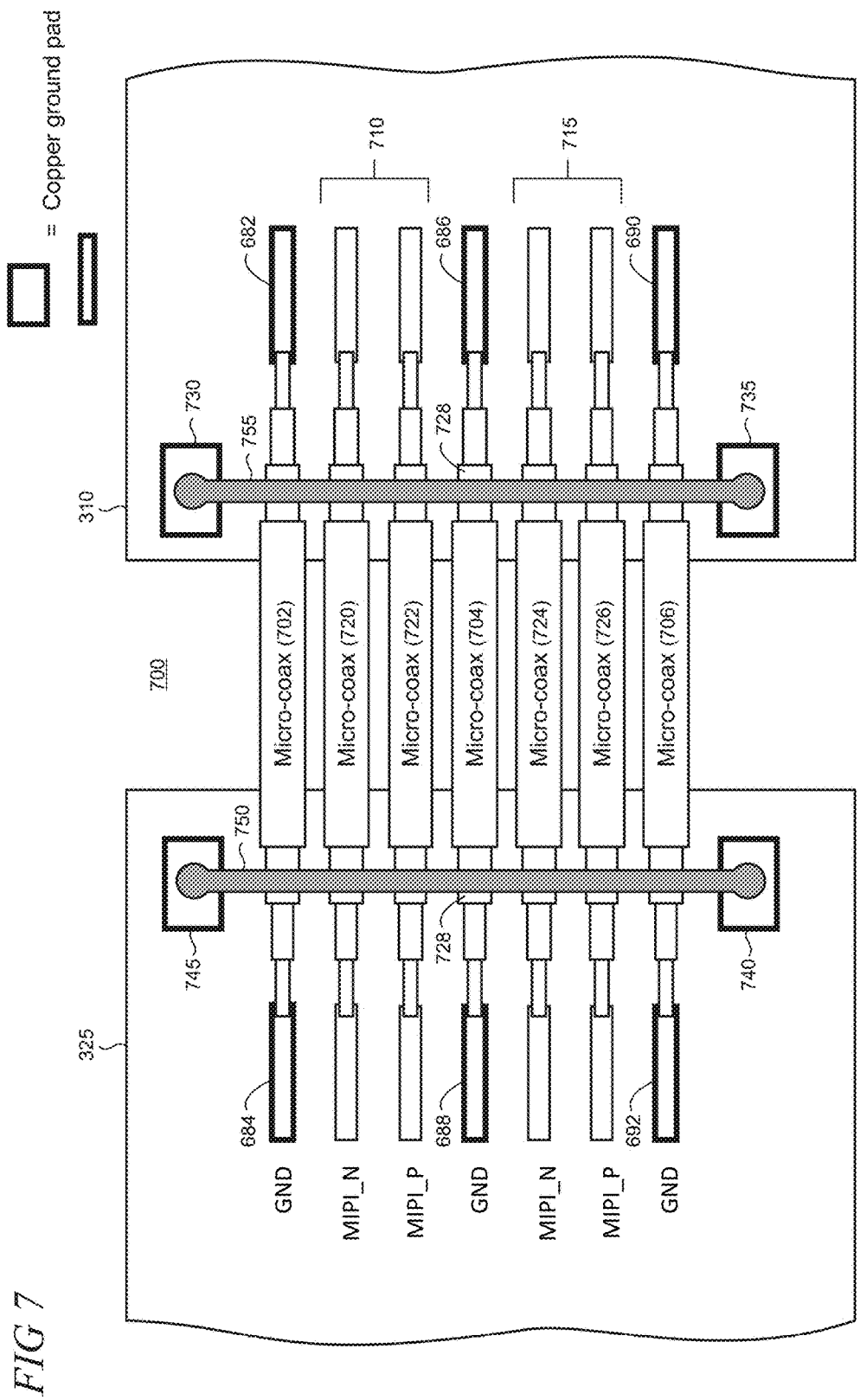
FIG. 7 shows a top view of an illustrative micro-coax cable harness configured with additional micro-coax cable strands utilized for shielding.

While the harness 500 can provide satisfactory performance in some cases, it may not be optimal in HMD device applications where space is generally limited as the additional ground paths supported by the conducting fingers can consume valuable space in the connector portions of the harness. This sub-optimal space utilization can be exacerbated in embodiments where the harness is also configured to carry power, such as in the illustrative example shown in FIG. 2 and described in the accompanying text, because the ground shield pins do not typically carry return current. FIG. 7 shows a micro-coax cable harness 700 that may address these issues by being configured to include additional strands of micro-coax cable 702, 704, and 706 which can provide additional shielding for the harness.

The additional strands of micro-coax cable are interleaved between pairs of MIPI conductor pairs 710 and 715 that comprise micro-coax cable strands 720, 722, 724, and 726. While the harness 700 can provide increased performance in some cases as compared to the harness 500 (FIG. 5), the shielding may still be sub-optimal because each shield in the additional micro-coax cable strands is coupled to ground through a path that has relatively high impedance. For example, the shield 728 on micro-coax cable strand 704 is electrically coupled to respective ground pads 730, 735, 740, and 745 through the ground bars 750 and 755 at the extremities of the connections to the circuit boards 310 and 325.

Figure 8:
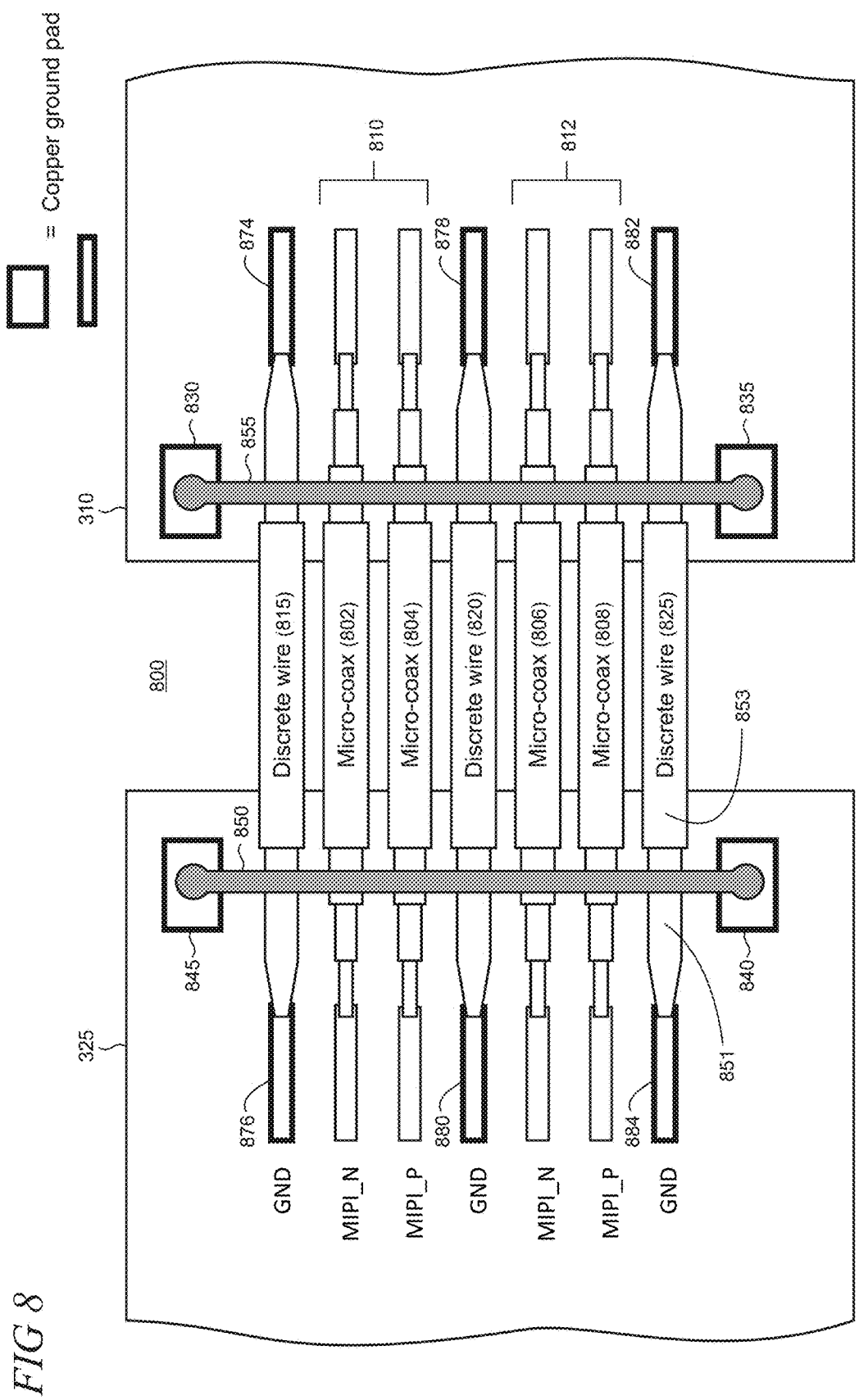
FIG. 8 shows a top view of a first illustrative embodiment of a micro-coax cable harness configured with discrete wires that are utilized for shielding and/or power.

FIG. 8 shows a first illustrative embodiment of a micro-coax cable harness 800 that optimizes shielding for high-speed signals such as MIPI differential signals in which discrete wires are utilized to provide a ground return path for electrical power. In this embodiment, the harness 800 includes four strands of micro-coax cable 802, 804, 806, and 808 that are arranged as two pairs of MIPI conductors 810 and 812. Discrete wires 815, 820, and 825 are interleaved between the MIPI conductor pairs to provide shielding for each conductor pair against noise produced by the other pair. Each discrete wire comprises a conductor and insulating outer jacket, as representatively indicated by reference numerals 851 and 853. Other arrangements and numbers of conductors and discrete wires can also be utilized to meet the needs of a particular micro-coax harness implementation.

The outer diameters of the discrete wires 815, 820, and 825 are selected to be substantially the same as that of the shields of the micro-coax cable strands 802, 804, 806, and 808. Ground bars 850 and 855, which may comprise upper and/or lower portions, are electrically coupled to the conductors of the discrete wires and the shields of the micro-coax cable strands to provide paths to the ground pads 830, 835, 840, and 845 on the respective circuit boards 310 and 325.

As shown, the distal ends of the discrete wires are terminated at respective ground pads 874, 876, 878, 880, 882, and 884 on the respective circuit boards 310 and 325. The electrical coupling may be effectuated using solder, conductive adhesive, metallic plating, friction fit, fastener, latch, connector, or any suitable method. A fabrication process can be applied to the discrete wires 815, 820, and 825 to size outer diameters of the ends of the conductors at the termination point with the respective ground pads to be substantially the same as that of the cores in the micro-coax cables in the harness 800. For example, laser etching may be applied to the ends of the discrete wires to match their outer diameters to the outer diameters of each of the conductor cores of the adjacent micro-coax cables. The ends of the discrete wires are shown in FIG. 8 as being tapered by the fabrication process, but various different geometries may also be utilized according the requirements of a particular implementation.

The fabrication process can include laser etching which can be similarly implemented to that utilized for micro-coax cable stripping, as described above. Matching the outside diameters of the ends of the discrete wires to the cores of the micro-coax cables can provide a consistent pitch that may facilitate space-saving geometries for the harness, connector, and/or terminations. In addition, manufacturability of the harness may be enhanced particularly in view of the small wire sizes that are utilized in typical implementations that necessitate automated assembly methods. For example, the micro-coax cables in this illustrative example can be implemented using 40 AWG. Consistent diameters between the discrete wire conductors and micro-coax cores may further help to minimize interface impedance at the connector.

Figure 9:
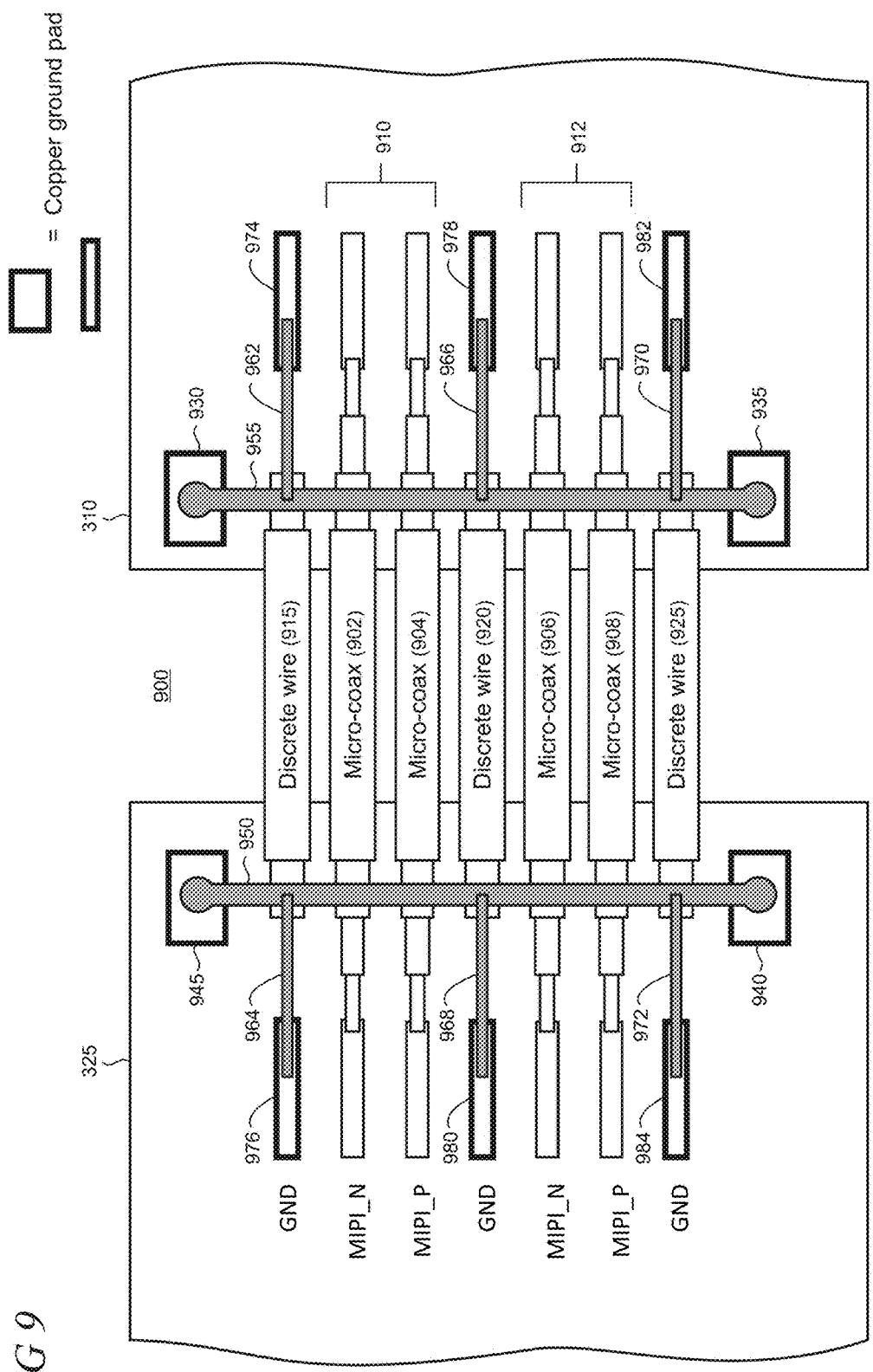
FIG. 9 shows a top view of a second illustrative embodiment of a micro-coax cable harness configured with discrete wires that are utilized for shielding and/or power.

FIG. 9 shows a second illustrative embodiment of a micro-coax cable harness 900 that optimizes shielding for high-speed signals such as MIPI differential signals in which discrete wires are utilized to provide a ground return path for electrical power. As with the embodiment shown in FIG. 8, the harness 900 includes four strands of micro-coax cable 902, 904, 906, and 908 that are arranged as two pairs of MIPI conductors 910 and 912, although other configurations can also be utilized. Discrete wires 915, 920, and 925 are interleaved between the MIPI conductor pairs to provide shielding for each conductor pair against noise produced by the other pair.

Instead of terminating the ends of the discrete wires on the ground pads as in the embodiment shown in FIG. 8, in this embodiment the discrete wires are cut to a suitable length to terminate near the interfaces with the ground bars 950 and 955. The cutting can be implemented using a laser fabrication process that may be similarly implemented to that utilized for micro-coax cable stripping, as described above.

Laterally extending conducting fingers 962, 964, 966, 968, 970, and 972 are utilized to provide ground paths to respective ground pads 974, 976, 978, 980, 982, and 984. Ground bars 950 and 955, which may comprise upper and/or lower portions, are electrically coupled to the discrete wires and shields of the micro-coax cable strands to provide paths to the ground pads 930, 935, 940, and 945 on the respective circuit boards 310 and 325. The laterally extending fingers can be terminated on the ground pads using solder, conductive adhesive, metallic plating, friction fit, fastener, latch, connector, or any suitable method.

Figure 10:
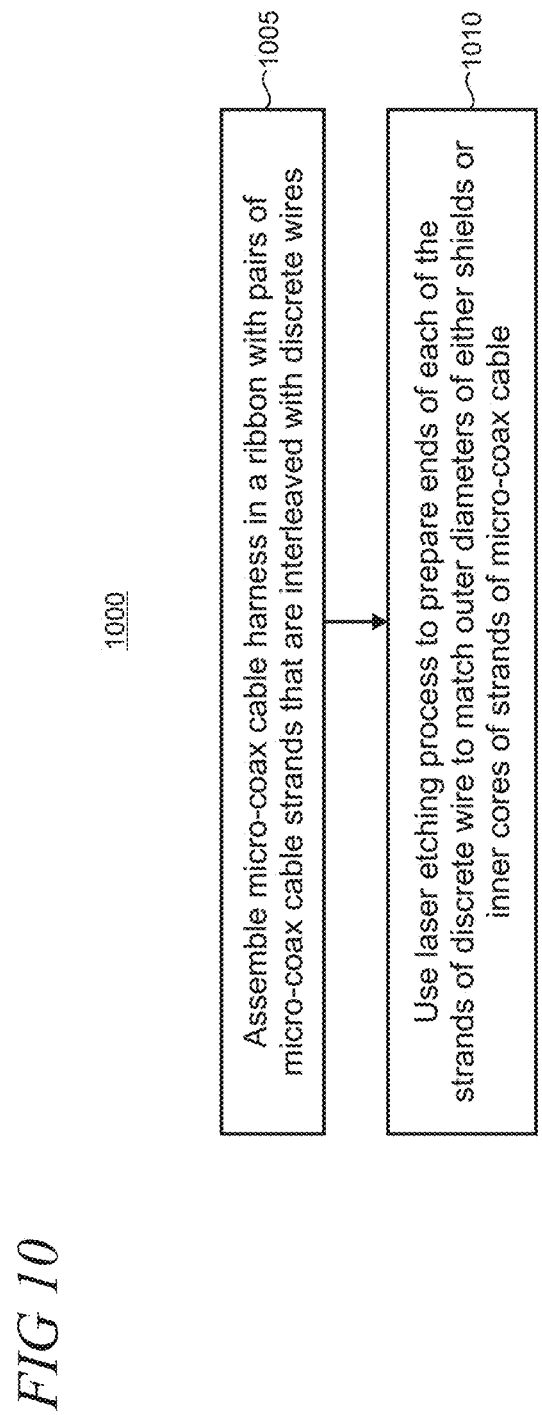
FIG. 10 is a flowchart of an illustrative method for assembling circuits using a micro-coax cable harness.

FIG. 10 is a flowchart of an illustrative method 1000 for assembling circuits using a micro-coax cable harness that may be used in an electronic device. Unless specifically stated, the methods or steps shown in the flowchart and described in the accompanying text are not constrained to a particular order or sequence. In addition, some of the methods or steps thereof can occur or be performed concurrently and not all the methods or steps have to be performed in a given implementation depending on the requirements of such implementation and some methods or steps may be optionally utilized.

In step 1005, a micro-coax cable harness is assembled in a ribbon configuration in which pairs of adjacently-located micro-coax cable strands are configured to carry differential signaling and strands of discrete wires are interleaved among the pairs of micro-coax cable strands. In step 1010, as with the first illustrative embodiment shown in FIG. 8, a laser etching process is used to prepare the ends of each of the discrete wire strands and micro-coax cable strands to have matching outer diameters between the conductors of the discrete wire strands and the inner cores of the micro-coax cable strands. Alternatively, as with the second illustrative embodiment shown in FIG. 9, a laser etching process is utilized to prepare the ends of each of the discrete wire strands and micro-coax cable strands to have matching outer diameters between the conductors of the discrete wire strands and the shields of the micro-coax cable strands. The preparation can include cutting the discrete wires to length in some cases. The laser etching process utilized for the fabrication or preparation of the ends of the micro-coax cable strands and discrete wire strands may be implemented using similar processes for laser stripping, as discussed above.

Figure 11:
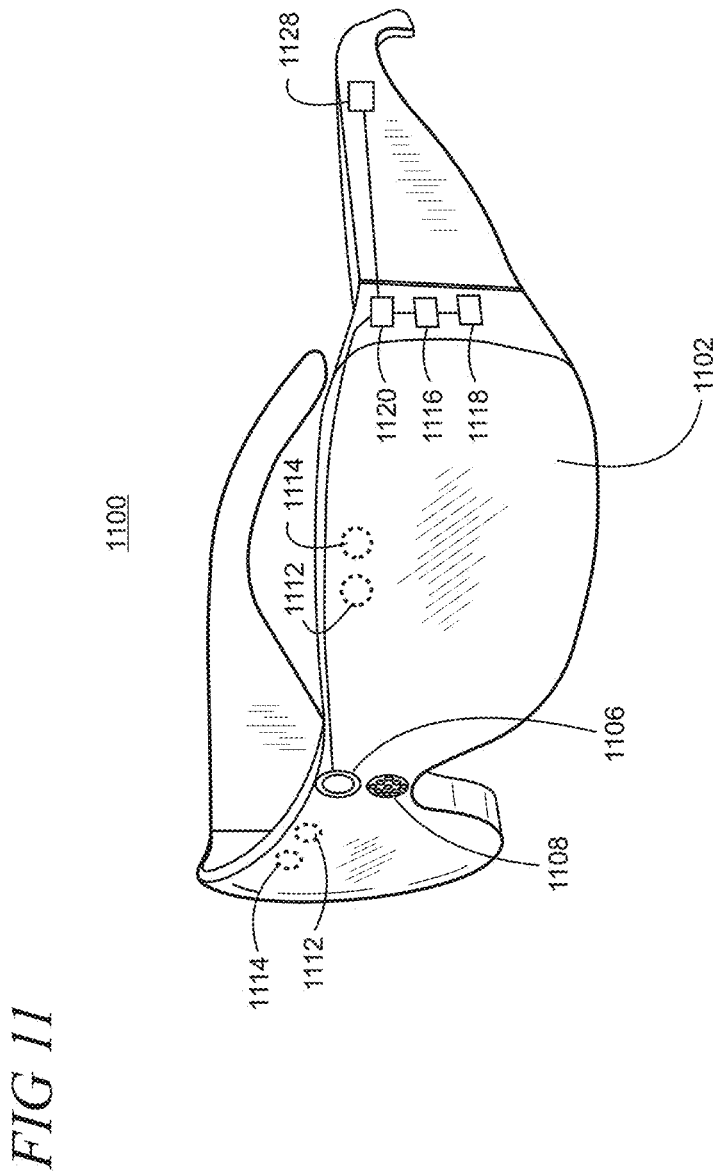
FIG. 11 is a pictorial view of an illustrative example of a virtual reality or augmented reality head mounted display (HMD) device.
Figure 12:
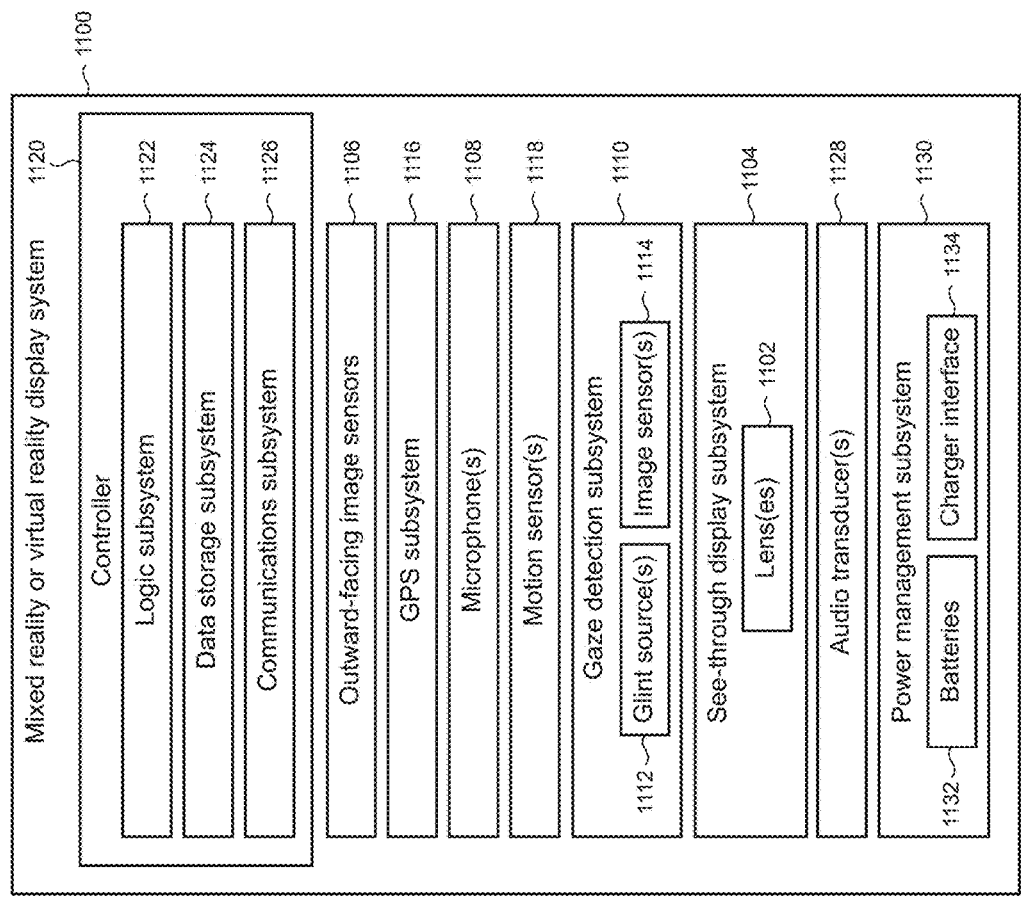
FIG. 12 shows a block diagram of an illustrative example of a virtual reality or augmented reality HMD device.

The present space-saving micro-coax cable harness may be utilized in compact form-factor devices such as HMD devices. FIG. 11 shows one particular illustrative example of a see-through, augmented reality or virtual reality display system 1100, and FIG. 12 shows a functional block diagram of the system 1100 that may be utilized as such an HMD device. Display system 1100 comprises one or more lenses 1102 that form a part of a see-through display subsystem 1104, such that images may be displayed using lenses 1102 (e.g. using projection onto lenses 1102, one or more waveguide systems incorporated into the lenses 1102, and/or in any other suitable manner). Display system 1100 further comprises one or more outward-facing image sensors 1106 configured to acquire images of a background scene and/or physical environment being viewed by a user, and may include one or more microphones 1108 configured to detect sounds, such as voice commands from a user. Outward-facing image sensors 1106 may include one or more depth sensors and/or one or more two-dimensional image sensors. In alternative arrangements, as noted above, an augmented reality or virtual reality display system, instead of incorporating a see-through display subsystem, may display augmented reality or virtual reality images through a viewfinder mode for an outward-facing image sensor.

The display system 1100 may further include a gaze detection subsystem 1110 configured for detecting a direction of gaze of each eye of a user or a direction or location of focus, as described above. Gaze detection subsystem 1110 may be configured to determine gaze directions of each of a user's eyes in any suitable manner. For example, in the illustrative example shown, a gaze detection subsystem 1110 includes one or more glint sources 1112, such as infrared light sources, that are configured to cause a glint of light to reflect from each eyeball of a user, and one or more image sensors 1114, such as inward-facing sensors, that are configured to capture an image of each eyeball of the user. Changes in the glints from the user's eyeballs and/or a location of a user's pupil, as determined from image data gathered using the image sensor(s) 1114, may be used to determine a direction of gaze.

In addition, a location at which gaze lines projected from the user's eyes intersect the external display may be used to determine an object at which the user is gazing (e.g. a displayed virtual object and/or real background object). Gaze detection subsystem 1110 may have any suitable number and arrangement of light sources and image sensors. In some implementations, the gaze detection subsystem 1110 may be omitted.

The display system 1100 may also include additional sensors. For example, display system 1100 may comprise a global positioning system (GPS) subsystem 1116 to allow a location of the display system 1100 to be determined. This may help to identify real-world objects, such as buildings, etc. that may be located in the user's adjoining physical environment.

The display system 1100 may further include one or more motion sensors 1118 (e.g., inertial, multi-axis gyroscopic, or acceleration sensors) to detect movement and position/orientation/pose of a user's head when the user is wearing the system as part of an augmented reality or virtual reality HMD device. Motion data may be used, potentially along with eye-tracking glint data and outward-facing image data, for gaze detection, as well as for image stabilization to help correct for blur in images from the outward-facing image sensor(s) 1106. The use of motion data may allow changes in gaze location to be tracked even if image data from outward-facing image sensor(s) 1106 cannot be resolved.

In addition, motion sensors 1118, as well as microphone(s) 1108 and gaze detection subsystem 1110, also may be employed as user input devices, such that a user may interact with the display system 1100 via gestures of the eye, neck and/or head, as well as via verbal commands in some cases. It may be understood that sensors illustrated in FIGS. 11 and 12 and described in the accompanying text are included for the purpose of example and are not intended to be limiting in any manner, as any other suitable sensors and/or combination of sensors may be utilized to meet the needs of a particular implementation. For example, biometric sensors (e.g., for detecting heart and respiration rates, blood pressure, brain activity, body temperature, etc.) or environmental sensors (e.g., for detecting temperature, humidity, elevation, UV (ultraviolet) light levels, etc.) may be utilized in some implementations.

The display system 1100 can further include a controller 1120 having a logic subsystem 1122 and a data storage subsystem 1124 in communication with the sensors, gaze detection subsystem 1110, display subsystem 1104, and/or other components through a communications subsystem 1126. The communications subsystem 1126 can also facilitate the display system being operated in conjunction with remotely located resources, such as processing, storage, power, data, and services. That is, in some implementations, an HMD device can be operated as part of a system that can distribute resources and capabilities among different components and subsystems.

The storage subsystem 1124 may include instructions stored thereon that are executable by logic subsystem 1122, for example, to receive and interpret inputs from the sensors, to identify location and movements of a user, to identify real objects using surface reconstruction and other techniques, and dim/fade the display based on distance to objects so as to enable the objects to be seen by the user, among other tasks.

The display system 1100 is configured with one or more audio transducers 1128 (e.g., speakers, earphones, etc.) so that audio can be utilized as part of an augmented reality or virtual reality experience. A power management subsystem 1130 may include one or more batteries 1132 and/or protection circuit modules (PCMs) and an associated charger interface 1134 and/or remote power interface for supplying power to components in the display system 1100.

It may be appreciated that the display system 1100 is described for the purpose of example, and thus is not meant to be limiting. It may be further understood that the display device may include additional and/or alternative sensors, cameras, microphones, input devices, output devices, etc. than those shown without departing from the scope of the present arrangement. Additionally, the physical configuration of a display device and its various sensors and subcomponents may take a variety of different forms without departing from the scope of the present arrangement.

Figure 13:
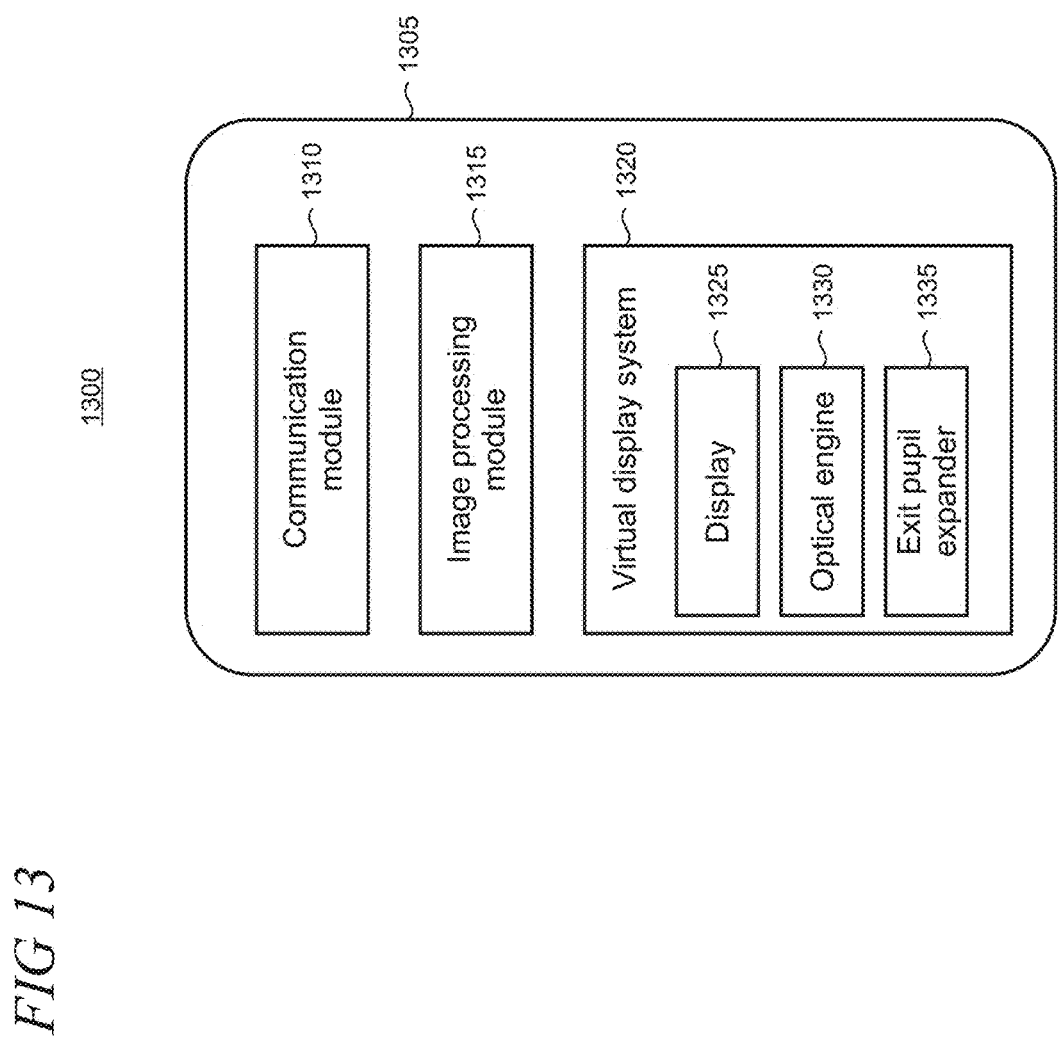
FIG. 13 shows a block diagram of an illustrative electronic device that incorporates an augmented reality or virtual reality display system.

As shown in FIG. 13, an augmented reality or virtual reality display system using the present space-saving micro-coax cable harness can be used in a mobile or portable electronic device 1300, such as a mobile phone, smartphone, personal digital assistant (PDA), communicator, portable Internet appliance, hand-held computer, digital video or still camera, wearable computer, computer game device, specialized bring-to-the-eye product for viewing, or other portable electronic device. As shown, the portable device 1300 includes a housing 1305 to house a communication module 1310 for receiving and transmitting information from and to an external device, or a remote system or service (not shown).

The portable device 1300 may also include an image processing module 1315 for handling the received and transmitted information, and a virtual display system 1320 to support viewing of images. The virtual display system 1320 can include a micro-display or an imager 1325 and an optical engine 1330. The image processing module 1315 may be operatively connected to the optical engine 1330 to provide image data, such as video data, to the imager 1325 to display an image thereon. An exit pupil expander (EPE) 1335 can be optically linked to an optical engine 1330. The EPE may incorporate or be part of a display system that supports augmented reality or virtual reality images.

The present space-saving micro-coax cable harness may also be utilized in an augmented reality or virtual reality display system utilized in non-portable devices, such as gaming devices, multimedia consoles, personal computers, vending machines, smart appliances, Internet-connected devices, and home appliances, such as an oven, microwave oven and other appliances, and other non-portable devices.

Various exemplary embodiments of the present space-saving micro-coax cable harness are now presented by way of illustration and not as an exhaustive list of all embodiments. An example includes a cable harness configured to provide electrical interconnections between electronic devices, comprising: one or more strands of coaxial cable having an inner core and a coaxial shield; one or more strands of discrete wire having a conductor; and at least one ground bar in conductive engagement with a conductor in at least one strand of discrete wire and further in conductive engagement with a shield in at least one strand of coaxial cable, wherein the ground bar provides a ground path to the engaged conductor and the engaged shield when the ground bar is terminated to one or more ground pads on an electrical component, and wherein each end of the conductors in the discrete wire strands have portions with an outer diameter that substantially matches an outer diameter of each of the inner cores of the coaxial cable strands.

In another example, the coaxial cable strands and discrete wire strands are in a ribbon or bundle configuration. In another example, strands of coaxial cable are arranged in the cable harness in pairs as differential signal lines. In another example, inner cores of the coaxial cable strands are terminated to signal pads on the electrical component. In another example, the cable harness further includes a connector providing terminations for one or more of the discrete wire strands, coaxial cable strands, or ground bar to the electrical component, in which the terminations include signal and ground terminations. In another example, the terminations are implemented with one or more of solder, conductive adhesive, conductive matrix, conductive foam, metallic plating, friction fit, fastener, latch, or connectorization process. In another example, the discrete wire strands and coaxial cable strands are each attached to, partially encased, or fully encased in a substrate. In another example, the cable harness is arranged as a ribbon and strands of discrete wires are disposed adjacent to pairs of strands of coaxial cable in the ribbon. In another example, the ground bar includes upper and lower portions, each of the upper and lower portions including respective receiving areas for the shields of the coaxial cable strands and the conductors of the discrete wire strands. In another example, the harness is arranged in a ribbon and the ground bar is configured to extend across a short axis of the ribbon that is substantially orthogonal to a long axis of the ribbon and wherein the coaxial cable strands and discrete wire strands are located in the ribbon to be parallel to the long axis. In another example, the harness is arranged as a ribbon and the ends of each of the conductors of the discrete wire strands and inner cores of the coaxial cable strands are located in the ribbon with a consistent pitch.

A further example includes a cable harness configured to provide electrical interconnects between electronic devices, comprising: In another example, one or more strands of coaxial cable having an inner core and a coaxial shield; one or more strands of discrete wire having a conductor; at least one ground bar in conductive engagement with a conductor in at least one strand of discrete wire and further in conductive engagement with a shield in at least one strand of coaxial cable, wherein the ground bar provides a ground path to the engaged conductor and the engaged shield when the ground bar is terminated to one or more ground pads on an electrical component, and wherein the ground bar further comprises one or more conducting fingers that extend from the ground bar to provide respective one or more additional ground paths when the conducting fingers are terminated to respective ground pads on the electronic component.

In another example, the conductive engagement between the ground bar and the conductor and shield is implemented with one or more of solder, conductive adhesive, metallic plating, friction fit, fastener, latch, or connectorization process. In another example, the electrical component includes one of circuit board, component, or device. In another example, the electrical component comprises an image sensor that operates using high-speed differential signaling over a pair of adjacent coaxial cable strands in the cable harness. In another example, one or more of the discrete wires are located within the cable harness to be adjacent to the pairs of coaxial cable strands to provide shielding for the high-speed differential signaling. In another example, the conducting fingers are interleaved between the pairs of coaxial cable strands at points of termination with the electrical component. In another example, one or more of the discrete wires provides return electrical pathway for a power source.

A further example includes a method of assembling a micro-coax cable harness, comprising: assembling the micro-coax cable harness in a ribbon configuration with pairs of adjacently-located micro-coax cable strands configured to carry differential signaling and interleaving strands of discrete wires among the pairs of micro-coax cable strands, wherein each strand of micro-coaxial cable includes an inner core and coaxial shield, and each discrete wire includes conductor and outer insulating jacket; and using a laser etching process to prepare the ends of each of the discrete wire strands and micro-coax cable strands to have matching outer diameters between the conductors of the discrete wire strands and the shields of the micro-coax cable strands, or using the laser etching process to prepare the ends of each of the discrete wire strands and micro-coax cable strands to have matching outer diameters between the conductors of the discrete wire strands and the inner cores of the micro-coax cable strands.

In another example, the method further includes assembling the micro-coax cable harness to a ground bar to be in conductive engagement with a conductor in at least one strand of discrete wire and further to be in conductive engagement with a shield in at least one strand of coaxial cable.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed:

1. A cable harness configured to provide electrical interconnections between electronic devices, comprising:
   one or more strands of coaxial cable each having an inner core and a coaxial shield;
   one or more strands of discrete wire each having a conductor; and
   at least one ground bar in conductive engagement with a respective conductor in at least one strand of discrete wire and further in conductive engagement with a coaxial shield in at least one strand of coaxial cable,
   wherein the ground bar provides a ground path to the engaged conductor and the engaged shield when the ground bar is terminated to one or more ground pads on an electrical component, and
   wherein each end of the conductors in the discrete wire strands have portions with an outer diameter that substantially matches an outer diameter of each of the inner cores of the coaxial cable strands.

2. The cable harness of claim 1 wherein the coaxial cable strands and discrete wire strands are in a ribbon or bundle configuration.

3. The cable harness of claim 1 wherein strands of coaxial cable are arranged in the cable harness in pairs as differential signal lines.

4. The cable harness of claim 1 wherein inner cores of the coaxial cable strands are terminated to signal pads on the electrical component.

5. The cable harness of claim 1 further including a connector providing terminations for one or more of the discrete wire strands, coaxial cable strands, or ground bar to the electrical component, in which the terminations include signal and ground terminations.

6. The cable harness of claim 5 in which the terminations are implemented with one or more of solder, conductive adhesive, conductive matrix, conductive foam, metallic plating, friction fit, fastener, latch, or connectorization process.

7. The cable harness of claim 1 in which the discrete wire strands and coaxial cable strands are each attached to, partially encased, or fully encased in a substrate.

8. The cable harness of claim 1 wherein the cable harness is arranged as a ribbon and strands of discrete wires are disposed adjacent to pairs of strands of coaxial cable in the ribbon.

9. The cable harness of claim 1 wherein the ground bar includes upper and lower portions, each of the upper and lower portions including respective receiving areas for the shields of the coaxial cable strands and the conductors of the discrete wire strands.

10. The cable harness of claim 1 wherein the harness is arranged in a ribbon and the ground bar is configured to extend across a short axis of the ribbon that is substantially orthogonal to a long axis of the ribbon and wherein the coaxial cable strands and discrete wire strands are located in the ribbon to be parallel to the long axis.

11. The cable harness of claim 1 wherein the harness is arranged as a ribbon and the ends of each of the conductors of the discrete wire strands and inner cores of the coaxial cable strands are located in the ribbon with a consistent pitch.

12. A cable harness configured to provide electrical interconnections between electronic devices, comprising:
  one or more strands of coaxial cable each having an inner core and a coaxial shield;
  one or more strands of discrete wire each having a conductor;
  at least one ground bar in conductive engagement with a respective conductor in at least one strand of discrete wire and further in conductive engagement with a shield in at least one strand of coaxial cable,
  wherein the ground bar provides a ground path to the engaged conductor and the engaged shield when the ground bar is terminated to one or more ground pads on an electrical component,
  wherein the ground bar further comprises one or more conducting fingers that extend from the ground bar to provide respective one or more additional ground paths when the conducting fingers are terminated to respective ground pads on the electronic component, and
  wherein one or more of the discrete wires provides a return electrical pathway for a power source.

13. The cable harness of claim 12 in which the conductive engagement between the ground bar and the conductor and shield is implemented with one or more of solder, conductive adhesive, metallic plating, friction fit, fastener, latch, or connectorization process.

14. The cable harness of claim 12 in which the electrical component includes one of circuit board, component, or device.

15. The cable harness of claim 12 in which the electrical component comprises an image sensor that operates using high-speed differential signaling over a pair of adjacent coaxial cable strands in the cable harness.

16. The cable harness of claim 15 in which one or more of the discrete wires are located within the cable harness to be adjacent to the pairs of coaxial cable strands to provide shielding for the high-speed differential signaling.

17. The cable harness of claim 16 in which the conducting fingers are interleaved between the pairs of coaxial cable strands at points of termination with the electrical component.

* * * * *